April 29, 1969 MASAO KAWASHIMA ET AL 3,441,750

SELECTIVE CONTROL OF BISTABLE CIRCUIT WITH DIFFERENTIATED PULSES

Filed Sept. 24, 1965

3,441,750

SELECTIVE CONTROL OF BISTABLE CIRCUIT WITH DIFFERENTIATED PULSES

Masao Kawashima, Shigehiko Hinoshita, and Maroshi Hoshino, Yokohama-shi, Japan, assignors to Fujitsu Limited, Kawasaki, Japan, a corporation of Japan Filed Sept. 24, 1965, Ser. No. 490,037
Claims priority, application Japan, Sept. 26, 1964, 39/55,156
Int. Cl. H03k *17/58*
U.S. Cl. 307—238 8 Claims

ABSTRACT OF THE DISCLOSURE

A differentiator to which a square wave read-in pulse is supplied provides a sharp positive trigger pulse at one of the leading and trailing edges of the read-in pulse and a sharp negative trigger pulse at the other of the leading and trailing edges of the read-in pulse. A control circuit comprising a diode and a switch connected in series circuit arrangement to a common point in the connection between the differentiator and a bistable circuit controls the application of at least one of the positive and negative trigger pulses to the bistable circuit. The bistable circuit comprises a tunnel diode in series circuit arrangement with a resistor and a source of constant DC bias voltage. The positive trigger pulse triggers the bistable circuit to one stable state and the negative trigger pulse triggers such circuit to another stable state.

The present invention relates to a binary signal producing circuit. More particularly, the invention relates to a circuit for producing binary read-in signals for a storage device.

The principal object of the present invention is to provide a new and improved binary signal producing circuit.

An object of the present invention is to provide a binary signal producing circuit of simplified structure, which functions efficiently, effectively and reliably.

In accordance with the present invention, a binary signal producing circuit comprises a bistable circuit having one stable state of operation triggered by a positive trigger pulse and representing one binary signal and another stable state of operation triggered by a negative trigger pulse and representing the other binary signal. The bistable circuit comprises a tunnel diode in series circuit arrangement with a resistor between a source of bias potential and a point at ground potential. A substantially square wave negative read-in pulse is supplied to the input of a differentiator having an output connected to the bistable circuit. The differentiator provides a sharp positive trigger pulse at the trailing edge of the read-in pulse and a sharp negative pulse at the leading edge of said read-in pulse. A control arrangement, comprising a diode and a switch connected in series circuit arrangement between a common point in the connection between the output of the differentiator and the bistable circuit and a point at ground potential, controls the application of the positive trigger pulses to the bistable circuit, the diode being connected to conduct the positive trigger signal to ground.

In order that the present invention may be readily carried into effect, it will now be described with reference to the accompanying drawing, wherein.

Figure 1:
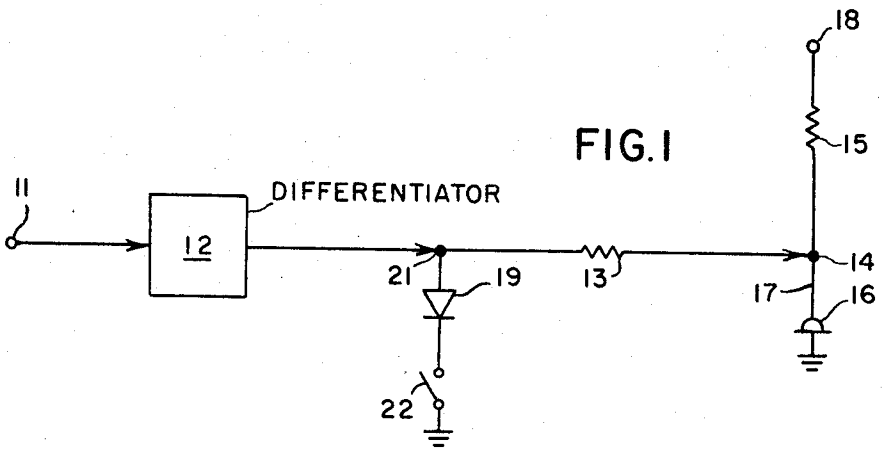
FIG. 1 is a circuit diagram of an embodiment of the binary signal producing circuit of the present invention.
Figure 3A:
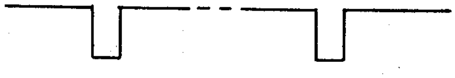
FIGS. 3*a*, 3*b* and 3*c* are waveforms appearing in the embodiment of FIG. 1.
Figure 3B:
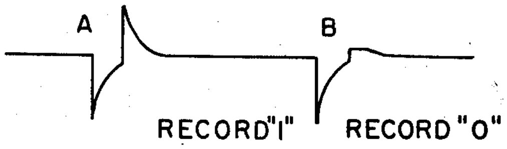

In FIG. 1, an input terminal 11 is connected to the input of a differentiator 12. The differentiator 12 may comprise any suitable differentiator known in the art and functions to produce a differentiated waveform as shown in FIG. 3*b* at its output when a square wave input as shown in FIG. 3*a* is supplied to its input. The input signal of FIG. 3*a*, which is supplied to the input terminal 11, may comprise a series of read-in or write pulses.

The output of the differentiator 12 is connected through a resistor 13 to a common point 14 in the connection between a resistor 15 and a tunnel or Esaki diode 16. The anode of the tunnel diode 16 is connected to the resistor 15 by a line 17. The other end of the resistor 15 is connected to a terminal 18 and the cathode of the tunnel diode 16 is connected to a point at ground potential.

A diode 19 is connected to a common point 21 in the connection between the output of the differentiator 12 and the resistor 13. A switch 22 is connected in series circuit arrangement with the diode 19, the anode of the diode being connected to the point 21, the cathode of the diode being connected to the switch and the switch being connected to a point at ground potential.

The tunnel diode 16 and the resistor 15 together function as a bistable circuit, as hereinafter explained in detail with reference to FIG. 2, and substantially square wave read-in or write pulses are supplied via the input terminal 11 and the differentiator 12. When a binary zero, "0" or no signal is to be stored or caused to be stored by the bistable circuit 15, 16, the switch 22 is closed and the circuit functions in the manner hereinafter described to produce a zero, "0" or no signal output. When a binary one, "1" or signal is to be stored or caused to be stored by the bistable circuit 15, 16, the switch 22 is opened, as shown in FIG. 1, and the circuit functions in the manner hereinafter described to produce a one, "1" or signal output. One stable state of the bistable circuit 15, 16 represents the "0" binary indication and the other stable state of said bistable circuit represents the "1" binary indication.

The tunnel or Esaki diode may comprise any suitable negative resistance device of such type, such as, for example, that described and illustrated in Computer Basics, vol. 6, Solid-State Computer Circuits by Technical Education and Management, Inc., Howard W. Sams & Co., Inc., The Bobbs-Merrill Company, Inc., 1962, pp. 147–156. The switch 22 may comprise any suitable switch such as, for example, an electronic switch such as, for example, a transistor.

Figure 2:
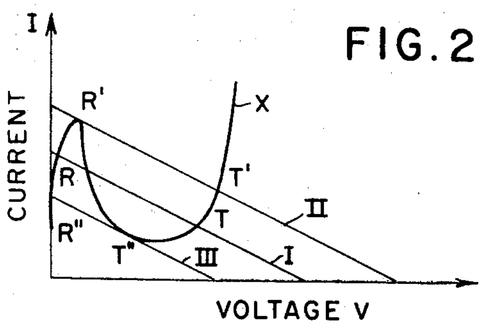
FIG. 2 is a graphical illustration explaining the operation of the embodiment of FIG. 1.

FIG. 2 illustrates the current-voltage characteristic of the tunnel diode 16. The abscissa represents the voltage in volts and the ordinate represents the current. Curve X of FIG. 2 illustrates the current-voltage characteristic of the tunnel diode 16. Each of the lines I, II and III illustrates the current-voltage characteristic of the rest of the circuit for different magnitudes of voltage at the point 21.

When the voltage at the point 21 is zero, the current-voltage characteristic of the circuit other than the bistable circuit 15, 16 is illustrated by the line I. The voltage at the point 14 of the bistable circuit 15, 16 is then stable at two stable points R and T where the line I intersects the curve X. The stable point R corresponds to the "0" binary signal and the stable point T corresponds to the "1" binary signal.

When the voltage at the point 21 increases, the line I moves parallel to itself farther from the origin and there are two points of intersection of the line and the curve X until said voltage is increased to form line II which is tangential to the curve X at the point R′ and intersects the said curve at the point T′. If the voltage at the point 21 is increased beyond the point where it forms the line II, said line II moves parallel to itself farther from the origin and intersects the curve X at only T points. When the voltage at the point 21 is decreased to zero, the bistable circuit 15, 16 indicates a "1" binary signal. This is called the set or setting operation.

When the voltage at the point 21 decreases, the line I moves parallel to itself closer to the origin and there are two points of intersection of the line and the curve X until said voltage is decreased to form line III which is tangential to the curve X at the point T″ and intersects the said curve at the point R″. If the voltage at the point 21 is decreased below the point where it forms the line III, said line III moves parallel to itself closer to the origin and intersects the curve X at only R points. When the voltage at the point 21 is decreased to zero, the bistable circuit 15, 16 indicates a "0" binary signal. This is called the reset or resetting operation.

If the bistable circuit 15, 16 is operating on its R branch, resetting does not change the point of operation. When it is desired to read-in or write a "0" or a "1" binary signal, this may be achieved by the binary signal producing circuit of the present invention with a single read-in or write pulse. Heretofore, separate positive and negative signals had to be supplied to the point 21 in order to set or reset, that is, to provide a "1" or "0" binary signal.

Thus, in accordance with the present invention, a read-in or write pulse of substantially square wave configuration supplied to the input terminal 11 is differentiated by the differentiator 12 to produce a relatively sharp negative pulse at the leading edge of said read-in pulse and a relatively sharp positive pulse at the trailing edge of said read-in pulse, as shown in FIG. 3*b*. In accordance with the present invention, the utilization of the differentiated pulse by the circuit of FIG. 1 is such that the negative pulse formed at the leading edge of the pulse is utilized for resetting or setting whereas the positive pulse formed at the trailing edge of the pulse is controlled by the signal to be read-in or written. When the leading edge pulse is utilized for resetting, the trailing edge pulse is fed to the bistable circuit 15, 16 to store or cause the storage of a signal only when a "1" binary signal is to be read-in. When the leading edge pulse is utilized for setting, however, the trailing edge pulse is fed to the bistable circuit 15, 16 to store or cause the storage of a signal only when a "0" binary signal is to be read-in.

Figure 3C:
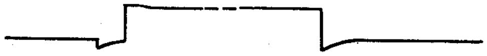

In FIG. 3*b*, the pulses A appear at the point 21 when the switch 22 is open and the pulse B appears at the point 21 when said switch is closed. The waveform of FIG. 3*c* appears at the point 14. FIG. 3*b* illustrates the situation wherein the leading edge pulse is utilized for resetting. The negative pulse at the leading edge of the read-in pulse is in the non-conductive direction of the diode 19, since said diode is connected to conduct only upon the appearance of a signal more positive than ground potential at the point 21. Thus, the negative pulse at the leading edge of the read-in pulse appears at the point 21 whether the switch 22 is closed or open and the bistable circuit 15, 16 is reset by said negative pulse regardless of the set previous condition it may have been in. When reset, the bistable circuit 15, 16 is reset to the lower potential side at the point 14.

The positive pulse at the trailing edge of the read-in pulse is in the conductive direction of the diode 19. Thus, when the switch 22 is closed, the positive pulse at the trailing edge of the read-in pulse is conducted to ground by the diode 19 and does not appear at the point 21. When the switch 22 is open, the positive pulse at the trailing edge of the read-in pulse appears at the point 21. The switch 22 is thus opened and closed in accordance with what binary signal is desired to be read-in or recorded.

The closing and opening of the switch 22 control the appearance of the positive pulse at the trailing edge of the read-in pulse in the aforedescribed manner to record or cause the recording of the binary signal. Thus, when the switch 22 is opened, the positive pulse appears at the point 21 and is supplied to the bistable circuit 15, 16 to record or cause the recording of a "1" binary signal. When the switch 22 is closed, the positive pulse is conducted off by the diode 19 and does not appear at the point 21 and the bistable circuit 15, 16 is reset and records or causes the recording of a "0" binary signal.

It is possible to apply a positive read-in pulse to the input terminal 11, rather than the negative pulse shown in FIG. 3*a*, and to provide a sharp positive pulse at the leading edge of the read-in pulse to read-in or cause the read-in of a "1" binary signal and a sharp negative pulse at the trailing edge of the read-in pulse to reset the bistable circuit 15, 16 and read-in or cause the read-in of a "0" binary signal.

While the invention has been described by means of specific examples and in a specific embodiment, we do not wish to be limited thereto, for obvious modifications will occur to those skilled in the art without departing from the spirit and scope of the invention.

We claim:

1. A binary signal producing circuit, comprising a bistable circuit having one stable state of operation triggered by a positive trigger pulse and representing one binary signal and another stable state of operation triggered by a negative trigger pulse and representing the other binary signal, said bistable circuit comprising a tunnel diode in series circuit arrangement with a resistor and a source of constant DC bias voltage;

read-in pulse means for supplying a substantially square wave read-in pulse;

differentiating means having an input connected to said read-in pulse means and an output connected to said bistable circuit for providing a sharp positive trigger pulse at one of the leading and trailing edges of said read-in pulse and a sharp negative trigger pulse at the other of the leading and trailing edges of said read-in pulse; and control means interposed between the output of said differentiating means and said bistable circuit for controlling the application of at least one of said positive and negative trigger pulses to said bistable circuit, said control means comprising a diode and a switch connected in series circuit arrangement to a common point in the connection between the output of said differentiator and said bistable circuit.

2. A binary signal producing circuit as claimed in claim 1, wherein said control means comprises a diode and a switch connected in series circuit arrangement between a common point in the connection between the output of said differentiator and said bistable circuit and a point at ground potential.

3. A binary signal producing circuit as claimed in claim 2, wherein said bistable circuit comprises a tunnel diode in series circuit arrangement with a resistor between said source of constant DC bias voltage and a point at ground potential.

4. A binary signal producing circuit as claimed in claim 1, wherein said read-in pulse comprises a substantially square wave negative pulse, said differentiating means provides said positive trigger pulse at the trailing edge of said read-in pulse and said negative trigger pulse at the leading edge of said read-in pulse, and said control means controls the application of said positive trigger pulses to said bistable circuit.

5. A binary signal producing circuit as claimed in claim 4, wherein said control means comprises a diode and a switch connected in series circuit arrangement between a common point in the connection between the output of said differentiator and said bistable circuit and a point at ground potential, said diode being connected to conduct said positive trigger signal to ground.

6. A binary signal producing circuit as claimed in claim 4, wherein said bistable circuit comprises a tunnel diode in series circuit arrangement with a resistor between said source of constant DC bias voltage and a point at ground potential.

7. A binary signal producing circuit as claimed in claim 6, wherein said control means comprises a diode and a switch connected in series circuit arrangement between a common point in the connection between the output of said differentiator and said bistable circuit and a point at ground potential, said diode being connected to conduct said positive trigger signal to ground.

8. A binary signal producing circuit as claimed in claim 7, wherein said one stable state of operation comprises the set condition representing the "1" binary signal and said other stable state of operation comprises the reset condition and represents the "0" binary signal.

References Cited

UNITED STATES PATENTS

| | | | |
|---|---|---|---|
| 3,096,449 | 7/1963 | Stucki | 307—258 |
| 3,233,119 | 2/1966 | Kruj | 307—286 X |
| 3,274,399 | 9/1966 | Sheng | 307—286 X |

OTHER REFERENCES

Electronics, Mar. 8, 1963, pp. 35–39.

ARTHUR GAUSS, *Primary Examiner.*

DONALD D. FORRER, *Assistant Examiner.*

U.S. Cl. X.R.

307—237, 261, 286; 340—173